United States Patent
Han et al.

(10) Patent No.: US 10,410,990 B2
(45) Date of Patent: Sep. 10, 2019

(54) JIG FOR BONDING A SEMICONDUCTOR CHIP, APPARATUS FOR BONDING A SEMICONDUCTOR CHIP INCLUDING THE JIG, AND METHOD OF BONDING A SEMICONDUCTOR CHIP USING THE APPARATUS

(71) Applicant: Samsung Electronics Co., Ltd., Suwon-si, Gyeonggi-do (KR)

(72) Inventors: Man-Hee Han, Asan-si (KR); Dae-Sang Chan, Asan-si (KR); Sung-Il Cho, Asan-si (KR); Jung-Lae Jung, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/937,984

(22) Filed: Mar. 28, 2018

(65) Prior Publication Data

US 2019/0103376 A1    Apr. 4, 2019

(30) Foreign Application Priority Data

Sep. 29, 2017 (KR) .................. 10-2017-0126803

(51) Int. Cl.
*H01L 23/00* (2006.01)
*B23K 1/00* (2006.01)
(Continued)

(52) U.S. Cl.
CPC ............ *H01L 24/75* (2013.01); *B23K 1/0016* (2013.01); *B23K 1/0056* (2013.01); *B23K 3/087* (2013.01); *H01L 24/81* (2013.01); *B23K 2101/40* (2018.08); *H01L 2224/7501* (2013.01); *H01L 2224/75263* (2013.01); *H01L 2224/75302* (2013.01); *H01L 2224/75312* (2013.01); *H01L 2224/75314* (2013.01); *H01L 2224/81022* (2013.01); *H01L 2224/81024* (2013.01);
(Continued)

(58) Field of Classification Search
None
See application file for complete search history.

(56) References Cited

U.S. PATENT DOCUMENTS 6,713,714 B1    3/2004  Azdasht
8,853,002 B2   10/2014  Lin et al.
(Continued)

FOREIGN PATENT DOCUMENTS

JP    2001-148403 A    5/2001
JP    3646687 B2       2/2005
(Continued)

*Primary Examiner* — Asok K Sarkar
(74) *Attorney, Agent, or Firm* — Sughrue Mion, PLLC

(57) ABSTRACT

A jig for bonding a semiconductor chip may include a pressurizing portion and at least one opening. The pressuring portion may be configured to pressurize an upper surface of the semiconductor chip bonded to a package substrate via a bump and a flux using a laser. The opening may be surrounded by the pressurizing portion. The laser irradiated to the bump and the flux may be transmitted through the opening. A vapor generated from the flux by the laser may be discharged through the opening. Thus, the contamination of the jig caused by the vapor may be prevented so that a transmissivity of the laser through the jig may be maintained.

20 Claims, 8 Drawing Sheets

(51) Int. Cl.
 *B23K 1/005* (2006.01)
 *B23K 3/08* (2006.01)
 *B23K 101/40* (2006.01)

(52) U.S. Cl.
 CPC ............... *H01L 2224/81224* (2013.01); *H01L 2224/81815* (2013.01)

(56) References Cited

U.S. PATENT DOCUMENTS

| | | |
|---|---|---|
| 9,162,320 B2 | 10/2015 | Tanaka et al. |
| 9,373,590 B1 | 6/2016 | Interrante et al. |
| 2007/0215584 A1 | 9/2007 | Nam et al. |
| 2014/0001163 A1* | 1/2014 | Tanaka .................. B23K 26/22 219/121.63 |
| 2016/0358890 A1* | 12/2016 | Heinrich ................ H01L 24/81 |
| 2018/0204740 A1* | 7/2018 | Yoon ....................... H01L 24/81 |

FOREIGN PATENT DOCUMENTS

| | | |
|---|---|---|
| JP | 3885388 B2 | 12/2006 |
| KR | 10-2001-0108103 A1 | 12/2001 |
| KR | 10-1111428 B1 | 1/2012 |
| KR | 10-1177292 B1 | 8/2012 |
| KR | 10-2017-0053320 A | 5/2017 |

\* cited by examiner

JIG FOR BONDING A SEMICONDUCTOR CHIP, APPARATUS FOR BONDING A SEMICONDUCTOR CHIP INCLUDING THE JIG, AND METHOD OF BONDING A SEMICONDUCTOR CHIP USING THE APPARATUS

CROSS-REFERENCE TO RELATED APPLICATION

This application claims priority under 35 USC § 119 to Korean Patent Application No. 10-2017-0126803, filed Sep. 29, 2017 in the Korean Intellectual Property Office (KIPO), the contents of which are hereby incorporated herein by reference in its entirety.

FIELD

Example embodiments relate to a jig for bonding a semiconductor chip, an apparatus for bonding a semiconductor chip including the jig, and a method of bonding a semiconductor chip using the apparatus. More particularly, example embodiments relate to a jig configured to pressurize a semiconductor chip when bonding the semiconductor chip to a package substrate via a bump and a flux, an apparatus for bonding a semiconductor chip including the jig, and a method of bonding a semiconductor chip using the apparatus.

BACKGROUND

Generally, a semiconductor chip may be electrically connected with a package substrate via a bump. The bump may be interposed between a pad of the semiconductor chip and a pad of the package substrate. When the semiconductor chip may be bonded to the package substrate using a laser, a jig for preventing a warpage of the semiconductor chip may be arranged on an upper surface of the semiconductor chip.

According to related arts, the jig may include a transparent material through which the laser may be transmitted. Thus, the laser may be irradiated to the bump and a flux through the jig so that the bump and the flux may be partially melted. During the bonding process, a vapor generated from the flux may infiltrate into a space between the semiconductor chip and the jig. The infiltrating vapor may contaminate the jig. The laser may not be transmitted through a contaminated portion of the jig so that an adhesion force of the semiconductor chip may be greatly reduced. In order to prevent the adhesion force from being reduced, it may be required to frequently clean the jig.

SUMMARY

Example embodiments provide a jig for bonding a semiconductor chip that may be capable of preventing the jig from being contaminated by a vapor generated from a flux.

Example embodiments also provide an apparatus for bonding a semiconductor chip including the above-mentioned jig.

Example embodiments still also provide a method of bonding a semiconductor chip using the above-mentioned apparatus.

According to example embodiments, there may be provided a jig for bonding a semiconductor chip. The jig may include a pressurizing portion and at least one opening. The pressuring portion may be configured to pressurize an upper surface of the semiconductor chip when bonding the semiconductor chip to a package substrate via a bump and a flux using a laser. The opening may be surrounded by the pressurizing portion. The bump and the flux may be exposed to laser radiation through the opening. A vapor generated from the flux by the laser may be discharged through the opening.

According to example embodiments, there may be provided an apparatus for bonding a semiconductor chip. The apparatus may include a laser irradiation unit and a jig. The laser irradiation unit may be arranged to expose a bump and a flux between the semiconductor chip and a package substrate to laser radiation. The jig may include a pressurizing portion and at least one opening. The pressurizing portion may be configured to pressurize an upper surface of the semiconductor chip when bonding the semiconductor chip to the package substrate via the bump and the flux using the laser. The opening may be surrounded by the pressurizing portion. The bump and the flux may be exposed to laser radiation through the opening. A vapor generated from the flux by the laser radiation may be discharged through the opening.

According to example embodiments, there may be provided a method of bonding a semiconductor chip. In the method of bonding the semiconductor chip, a bump and a flux may be disposed between a pad of the semiconductor chip and a pad of a package substrate. A jig may be disposed on an upper surface of the semiconductor chip. The jig may include a pressurizing portion and at least one opening. The pressuring portion may be configured to pressurize then upper surface of the semiconductor chip. The opening may be surrounded by the pressurizing portion. The bump and the flux may be exposed to laser radiation through the opening to bond the bump to the pads. A vapor generated from the flux by the laser may be discharged through the opening.

According to example embodiments, the vapor, which may be generated from the flux in the bonding process using the laser, infiltrating into the space between the semiconductor chip and the jig may be discharged through the opening. Thus, the contamination of the jig caused by the vapor may be prevented so that a transmissivity of the laser through the jig may be maintained. As a result, an adhesion force between the semiconductor chip and the package substrate may be improved. Particularly, because the jig may not be contaminated, it may not be required to clean the jig.

BRIEF DESCRIPTION OF THE DRAWINGS

Example embodiments will be more clearly understood from the following detailed description taken in conjunction with the accompanying drawings.

FIG. 1 is a plan view illustrating a jig for bonding a semiconductor chip in accordance with example embodiments;

FIG. 2 is a cross-sectional view taken along a line II-II' in FIG. 1;

FIG. 3 is a cross-sectional view illustrating the jig in FIG. 2 used in a process for bonding a semiconductor chip to a package substrate;

FIG. 4 is a cross-sectional view illustrating a jig for bonding a semiconductor chip in accordance with example embodiments;

FIG. 5 is a plan view illustrating a jig for bonding a semiconductor chip in accordance with example embodiments;

FIG. 6 is a cross-sectional view taken along a line VI-VI' in FIG. 5;

FIG. 7 is a cross-sectional view illustrating the jig in FIG. 6 used in a process for bonding a semiconductor chip to a package substrate;

FIG. 8 is a plan view illustrating a jig for bonding a semiconductor chip in accordance with example embodiments;

FIG. 9 is a plan view illustrating a jig for bonding a semiconductor chip in accordance with example embodiments;

FIG. 10 is a plan view illustrating a jig for bonding a semiconductor chip in accordance with example embodiments;

FIG. 11 is a cross-sectional view illustrating the jig in FIG. 10 used in a process for bonding a semiconductor chip to a package substrate;

FIG. 12 is a cross-sectional view illustrating an apparatus for bonding a semiconductor chip including the jig in FIG. 1; and FIGS. 13 to 16 are cross-sectional views illustrating a method of bonding a semiconductor chip to a package substrate using the jig in FIG. 1.

DETAILED DESCRIPTION OF THE EMBODIMENTS

Hereinafter, example embodiments will be explained in detail with reference to the accompanying drawings.

Jig for Bonding a Semiconductor Chip

Figure 1:
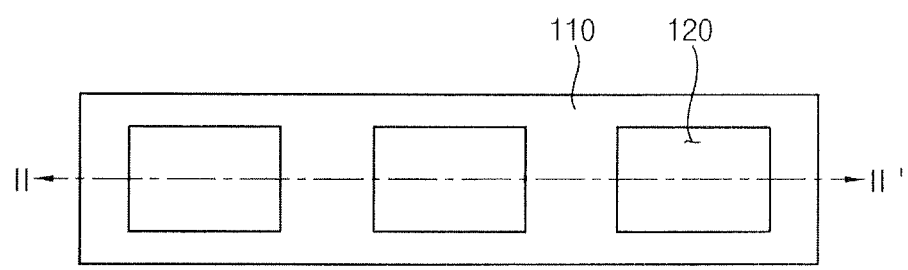
FIGS. 1 to 16 represent non-limiting, example embodiments as described herein.
Figure 2:
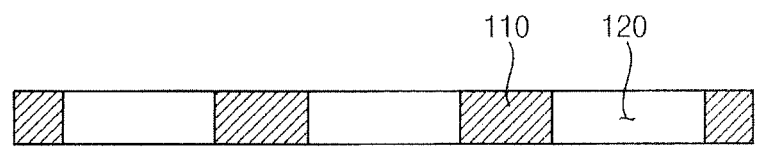
Figure 3:
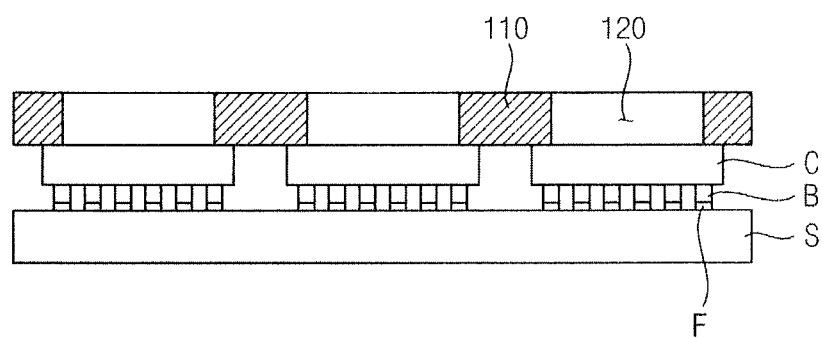

FIG. 1 is a plan view illustrating a jig for bonding a semiconductor chip in accordance with example embodiments, FIG. 2 is a cross-sectional view taken along a line II-II' in FIG. 1, and FIG. 3 is a cross-sectional view illustrating the jig in FIG. 2 used in a process for bonding a semiconductor chip to a package substrate.

Referring to FIGS. 1 to 3, a jig of this example embodiment may be used for bonding a semiconductor chip C to a package substrate S using a laser. Bumps B and fluxes F may be interposed between the semiconductor chip C and the package substrate S. The bumps B and the fluxes F may make contact with pads of the semiconductor chip C and pads of the package substrate S.

The jig may be arranged on an upper surface of the semiconductor chip C. The jig may pressurize the upper surface of the semiconductor chip C in a bonding process to prevent warpage of the semiconductor chip C. Further, the jig may be used for simultaneously bonding a plurality of the semiconductor chips C to the package substrate S. In this case, the jig may simultaneously pressurize the semiconductor chips C. Thus, the jig may have a size corresponding to a size of the package substrate S.

The jig may include a pressurizing portion 110 and a plurality of openings 120. The pressurizing portion 110 may be configured to pressurize the upper surface of each of the semiconductor chips C. The laser irradiated to the upper surfaces of the semiconductor chips C may be incident to the bumps B and the fluxes F through the openings 120. Thus, each of the openings 120 may be positioned over each of the semiconductor chips C. Further, a vapor may be generated from the fluxes F during the bonding process using the laser. The vapor may be discharged through the openings 120. Therefore, contamination of the jig caused by the vapor may be prevented. The openings 120 may be formed by forming a hole through the jig in a vertical direction.

In example embodiments, each of the openings 120 may be located at positions corresponding to positions of the semiconductor chips C. That is, one opening 120 may be arranged on a vertical line substantially perpendicular to the upper surface of one semiconductor chip C. Particularly, the opening 120 may be arranged on the vertical line passing through the bumps B. Because the bumps B may be arranged at a central portion of the semiconductor chip, a portion of the upper surface of the semiconductor chip C over the bumps B may be exposed through the opening 120. The positions of the opening 120 may be changed in accordance with the positions of the bumps B. Further, the opening 120 may have a rectangular shape. However, the opening 120 may have other shapes such as a circular shape, a polygonal shape, etc.

The pressurizing portion 110 may correspond to a portion of the jig at which the openings 120 may not be formed. That is, the pressurizing portion 110 may be arranged at a position shifted from the vertical line over the bumps B. The pressurizing portion 110 configured to surround the opening 120 may make contact with edge portions of the upper surface of the semiconductor chip C. Thus, the pressurizing portion 110 may pressurize the edge portions of the upper surface of the semiconductor chip C toward the package substrate S. The pressurizing portion 110 may pressurize the semiconductor chip C using a load of the pressurizing portion 110. Additionally, the pressurizing portion 110 may pressurize the semiconductor chip C using a pressure provided from a pressurizing unit as well as the load of the pressurizing portion 110.

In example embodiments, the pressurizing portion 110 may include a material through which the laser may not be transmitted. The pressurizing portion 110 including the material may function as to suppress a heat transfer to portions of the semiconductor chip C, which may not be heated desirably, i.e., other portions of the semiconductor chip C at which the bumps B may not be arranged. For example, the pressuring portion 110 may include a metal through which the opening 120 may be readily formed. Examples of the metal may include stainless steel, aluminum, etc.

Alternatively, the pressurizing portion 110 may include a material through which the laser may be transmitted. For example, the pressurizing portion 110 may include glass, quartz, transparent plastic, etc.

Figure 4:
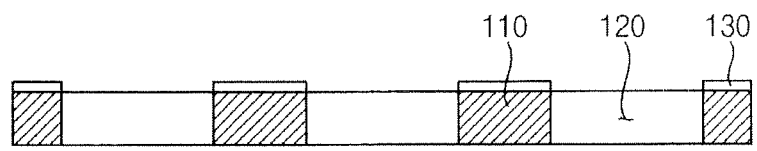

FIG. 4 is a cross-sectional view illustrating a jig for bonding a semiconductor chip in accordance with example embodiments.

A jig of this example embodiment may include elements substantially the same as those of the jig in FIG. 2 except for further including an anti-reflective layer. Thus, the same reference numerals may refer to the same elements and any further illustrations with respect to the same elements may be omitted herein for brevity.

Referring to FIG. 4, a jig of this example embodiment may include a pressurizing portion 110 including a metal. The laser may be reflected from the upper surface of the pressurizing portion 110. The reflected laser may have influence on a transmissivity of the laser through the opening 120.

Therefore, an anti-reflective layer 130 may be arranged on an upper surface of the pressurizing portion 110. The anti-reflective layer 130 may function as to prevent the reflection of the laser from the upper surface of the pressurizing portion 110 to maintain the transmissivity of the laser through the opening 120. The anti-reflective layer 130 may include a material for preventing the reflection of the laser. The material may not be restricted within a specific material.

Figure 5:
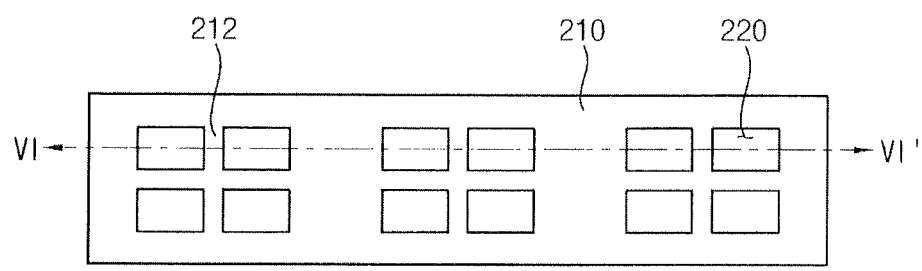
Figure 6:
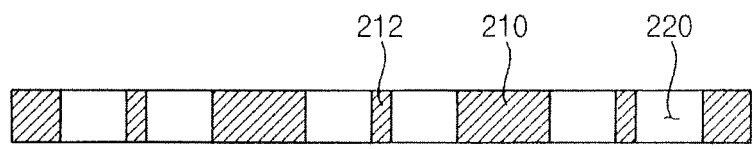
Figure 7:
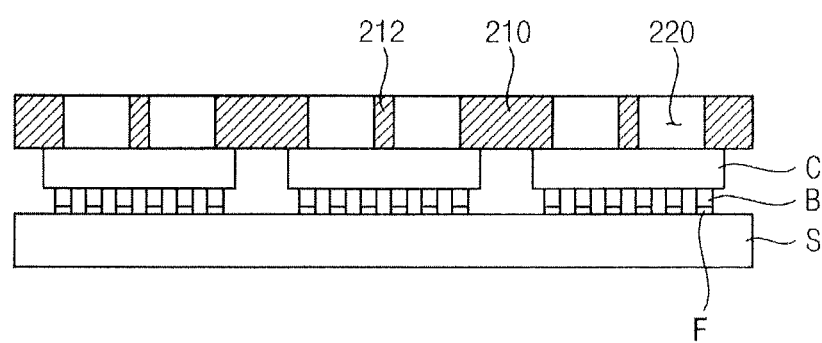

FIG. 5 is a plan view illustrating a jig for bonding a semiconductor chip in accordance with example embodiments, FIG. 6 is a cross-sectional view taken along a line VI-VI' in FIG. 5, and FIG. 7 is a cross-sectional view illustrating the jig in FIG. 6 used in a process for bonding a semiconductor chip to a package substrate.

Referring to FIGS. 5 to 7, a jig of this example embodiment may include a pressurizing portion 210, an auxiliary pressurizing portion 212 and a plurality of openings 220.

In example embodiments, the bumps B may be arranged at the central portion of the semiconductor chip C. Thus, each of the openings 220 may be arranged over the bumps B to expose the central portion of the upper surface of the semiconductor chip C. The opening 220 may have a rectangular shape. However, the opening 220 may have other shapes such as a circular shape, a polygonal shape, etc.

The pressurizing portion 210 may correspond to portions of the jig at which the openings 220 may not be formed. The pressurizing portion 210 configured to surround the opening 220 may make contact with the edge portion of the upper surface of the semiconductor chip C.

Because the central portion of the semiconductor chip C may be exposed through the opening 220, the central portion of the semiconductor chip C may not be pressurized so that the central portion of the semiconductor chip C may be bent. In order to prevent the central portion of the semiconductor chip C from being bent, the auxiliary pressurizing portion 212 may be arranged in the opening 220. The auxiliary pressurizing portion 212 may be extended from an inner surface of the pressurizing portion 210. The auxiliary pressurizing portion 212 may make contact with the central portion of the upper surface of the semiconductor chip C to pressurize the central portion of the upper surface of the semiconductor chip C exposed through the opening 220.

In example embodiments, the auxiliary pressurizing portion 212 may have a cross shape in the opening 220. The auxiliary pressurizing portion 212 having the cross shape may pass through a center point of the opening 220. The auxiliary pressurizing portion 212 may be substantially parallel to side surfaces of the opening 220. Thus, one opening 220 may be divided into four rectangular regions by the auxiliary pressurizing portion 212 having the cross shape. The four rectangular regions may have substantially the same size. Further, the four rectangular regions may be formed by forming holes through the jig so that the auxiliary pressurizing portion 212 may be integrally formed with the pressurizing portion 210. Alternatively, the auxiliary pressurizing portion 212 may be separated from the pressurizing portion 210.

When the auxiliary pressurizing portion 212 may include a material through which the laser may not be transmitted, the laser may not be directly applied to a portion of the upper surface of the semiconductor chip C under the auxiliary pressurizing portion 212. However, the laser may heat portions of the upper surface of the semiconductor chip C exposed through the four rectangular regions. The heat generated from the heated portions of the upper surface of the semiconductor chip C may be isotropically transferred in the semiconductor chip C in a thickness direction of the semiconductor chip C. Thus, the heat may be effectively transferred to the bump B under the auxiliary pressurizing portion 212. As a result, the bump B under the auxiliary pressurizing portion 212 may be firmly attached to the semiconductor chip C and the package substrate S.

When the auxiliary pressurizing portion 212 may have a wide width, a pressurizing force of the auxiliary pressurizing portion 212 to the central portion of the upper surface of the semiconductor chip C may be increased. However, the transmissivity of the laser through the opening 220 may be decreased. In contrast, when the auxiliary pressurizing portion 212 may have a narrow width, the transmissivity of the laser through the opening 220 may be increased. However, the pressurizing force of the auxiliary pressurizing portion 212 to the central portion of the upper surface of the semiconductor chip C may be decreased. Thus, the width of the auxiliary pressurizing portion 212 may be determined in accordance with the transmissivity of the laser through the opening 220 for providing the strong adhesion force, and the pressurizing force for preventing the warpage of the semiconductor chip C.

Further, as mentioned above, because the heat transfer from the upper surface of the semiconductor chip C to the bump B may be dependent upon the thickness of the semiconductor chip C, the width of the auxiliary pressurizing portion 212 may be determined in accordance with the thickness of the semiconductor chip C. In example embodiments, the width of the auxiliary pressurizing portion 212 may be about 0.1 mm to about 1.5 mm. The width of the auxiliary pressurizing portion 212 may be changed in accordance with the thickness of the semiconductor chip C. That is, a minimum width of the auxiliary pressurizing portion 212 may be decreased proportional to decreasing of the semiconductor chip C in thickness. In contrast, a maximum width of the auxiliary pressurizing portion 212 may be increased proportional to increasing of the semiconductor chip C in thickness.

Figure 8:
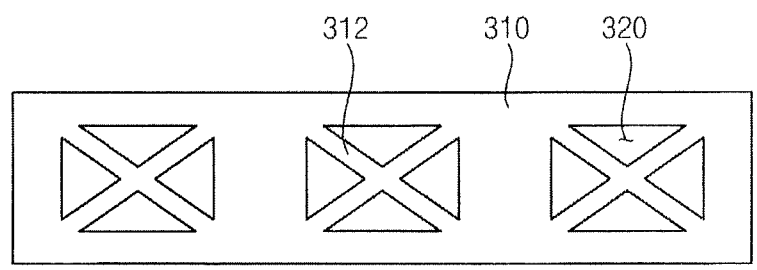

FIG. 8 is a plan view illustrating a jig for bonding a semiconductor chip in accordance with example embodiments.

Referring to FIG. 8, a jig of this example embodiment may include a pressurizing portion 310, an auxiliary pressurizing portion 312 and a plurality of openings 320.

In example embodiment, the bumps B may be arranged at the central portion of the semiconductor chip C. Thus, each of the openings 320 may be arranged over the bumps B to expose the central portion of the upper surface of the semiconductor chip C. The opening 320 may have a rectangular shape. However, the opening 320 may have other shapes such as a circular shape, a polygonal shape, etc.

The pressurizing portion 310 may correspond to portions of the jig at which the openings 320 may not be formed. The pressurizing portion 310 configured to surround the opening 320 may make contact with the edge portion of the upper surface of the semiconductor chip C.

The auxiliary pressurizing portion 312 may make contact with the central portion of the upper surface of the semiconductor chip C to pressurize the central portion of the upper surface of the semiconductor chip C exposed through the opening 320.

In example embodiments, the auxiliary pressurizing portion 312 may be arranged in the opening 320, along diagonal lines. Thus, one opening 320 may be divided into four isosceles triangular regions by the auxiliary pressurizing portion 312. The four isosceles triangular regions may have substantially the same size. Further, the four isosceles triangular regions may be formed by forming holes through the jig so that the auxiliary pressurizing portion 312 may be integrally formed with the pressurizing portion 310. Alternatively, the auxiliary pressurizing portion 312 may be separated from the pressurizing portion 310.

When the auxiliary pressurizing portion 312 may include a material through which the laser may not be transmitted, a width of the auxiliary pressurizing portion 312 may be determined in accordance with the transmissivity of the laser through the opening 320 for providing the strong adhesion force, the pressurizing force for preventing the warpage of the semiconductor chip C, and the thickness of the semiconductor chip C. In example embodiments, the width of the auxiliary pressurizing portion 312 may be about 0.1mm to about 1.5mm.

Alternatively, the auxiliary pressurizing portions 212 and 312 may have other shapes as well as the above-mentioned shape. For example, the auxiliary pressurizing portions 212 and 312 may have a shape that may not pass through the center point of the openings 220 and 320. Further, the auxiliary pressurizing portions 212 and 312 may have a concentric shape.

Figure 9:
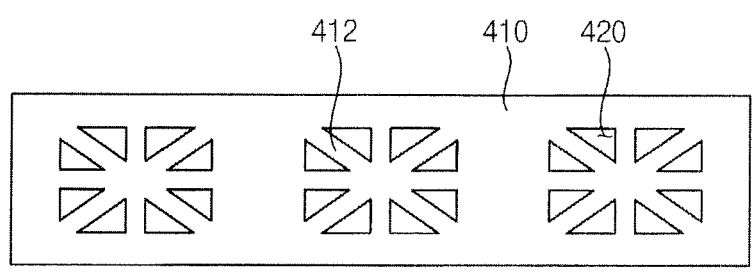

FIG. 9 is a plan view illustrating a jig for bonding a semiconductor chip in accordance with example embodiments.

Referring to FIG. 9, a jig of this example embodiment may include a pressurizing portion 410, an auxiliary pressurizing portion 412 and a plurality of openings 420.

In example embodiment, the bumps B may be arranged at the central portion of the semiconductor chip C. Thus, each of the openings 420 may be arranged over the bumps B to expose the central portion of the upper surface of the semiconductor chip C. The opening 420 may have a rectangular shape. However, the opening 420 may have other shapes such as a circular shape, a polygonal shape, etc.

The pressurizing portion 410 may correspond to portions of the jig at which the openings 420 may not be formed. The pressurizing portion 410 configured to surround the opening 420 may make contact with the edge portion of the upper surface of the semiconductor chip C.

The auxiliary pressurizing portion 412 may make contact with the central portion of the upper surface of the semiconductor chip C to pressurize the central portion of the upper surface of the semiconductor chip C exposed through the opening 420.

In example embodiments, the auxiliary pressurizing portion 412 may be arranged in the opening 420, along cross lines and diagonal lines. Thus, one opening 420 may be divided into eight right-angled triangular regions by the auxiliary pressurizing portion 412. The eight right-angled triangular regions may have substantially the same size. Further, the eight right-angled triangular regions may be formed by forming holes through the jig so that the auxiliary pressurizing portion 412 may be integrally formed with the pressurizing portion 410. Alternatively, the auxiliary pressurizing portion 412 may be separated from the pressurizing portion 410.

When the auxiliary pressurizing portion 412 may include a material through which the laser may not be transmitted, a width of the auxiliary pressurizing portion 412 may be determined in accordance with the transmissivity of the laser through the opening 420 for providing the strong adhesion force, the pressurizing force for preventing the warpage of the semiconductor chip C, and the thickness of the semiconductor chip C. In example embodiments, the width of the auxiliary pressurizing portion 412 may be about 0.1 mm to about 1.5 mm.

Figure 10:
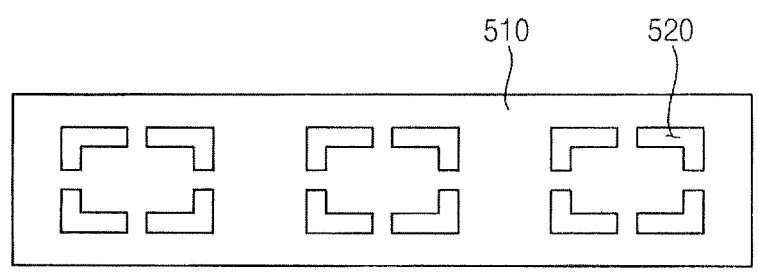
Figure 11:
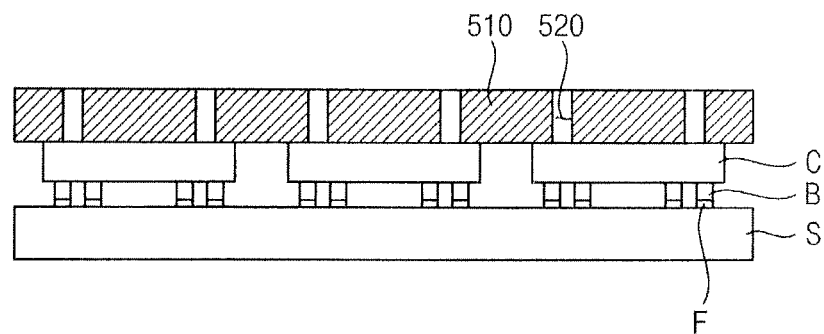

FIG. 10 is a plan view illustrating a jig for bonding a semiconductor chip in accordance with example embodiments, and FIG. 11 is a cross-sectional view illustrating the jig in FIG. 10 used in a process for bonding a semiconductor chip to a package substrate.

Referring to FIGS. 10 and 11, a jig of this example embodiment may include a pressurizing portion 510 and a plurality of openings 520.

In example embodiment, the bumps B may be arranged at corners of the semiconductor chip C. That is, the bumps B may not be arranged at the central portion of the semiconductor chip C. Thus, each of the openings 520 may be arranged over the bumps B to expose the corners of the upper surface of the semiconductor chip C. The opening 520 may have a shape having a right-angled bent portion at the corners.

The pressurizing portion 510 may correspond to portions of the jig at which the openings 520 may not be formed. The pressurizing portion 510 may make contact with the edge portion and the central portion of the upper surface of the semiconductor chip C.

Apparatus for Bonding a Semiconductor Chip

Figure 12:
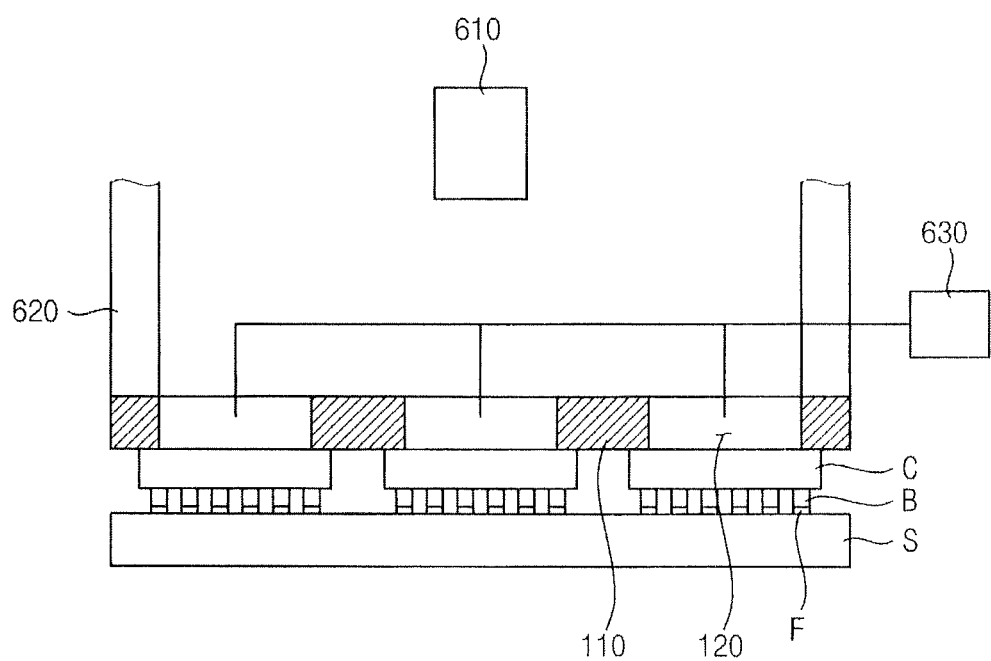

FIG. 12 is a cross-sectional view illustrating an apparatus for bonding a semiconductor chip including the jig in FIG. 1.

Referring to FIG. 12, an apparatus for bonding a semiconductor chip in accordance with example embodiments may include a laser irradiation unit 610, a jig, a pressurizing unit 620 and an exhausting unit 630.

The jig may be arranged on the upper surface of the semiconductor chip C. In example embodiments, the apparatus may include the jig in FIG. 1. Thus, any further illustrations with respect to the jig may be omitted herein for brevity. Alternatively, the apparatus may include the jig in FIG. 4, the jig in FIG. 5, the jig in FIG. 8, the jig in FIG. 9 or the jig in FIG. 10.

The laser irradiation unit 610 may be arranged over the jig. The laser irradiation unit 610 may be arranged to expose the bump B and the flux F between the semiconductor chip C and the package substrate S through the jig to laser radiation. Particularly, the bump B and the flux F may be exposed to laser radiation through the opening 120 of the jig.

The pressuring unit 620 may be arranged on the upper surface of the jig. Particularly, the pressurizing unit 620 may be arranged on the upper surface of the pressurizing portion 110 in the jig. The pressurizing unit 620 may press the upper surface of the pressuring portion 110 to pressurize the semiconductor chip C together with the pressurizing portion 110. The pressurizing unit 620 may have various structures, not restricted within a specific structure. Alternatively, when a sufficient pressurizing force may be applied to the semiconductor chip C to prevent the warpage of the semiconductor chip C using only the load of the jig, the apparatus may not include the pressurizing unit 620.

The exhausting unit 630 may be configured to apply a vacuum through the openings 120 of the jig. The vapor generated from the flux F in the bonding process may be discharged through the openings 120. The vapor may contaminate the laser irradiation unit 610. The exhausting unit 630 may exhaust the vapor outside the apparatus to prevent the laser irradiation unit 610 from being contaminated by the vapor.

Method of Bonding a Semiconductor Chip

FIGS. 13 to 16 are cross-sectional views illustrating a method of bonding a semiconductor chip to a package substrate using the jig in FIG. 1.

Figure 13:
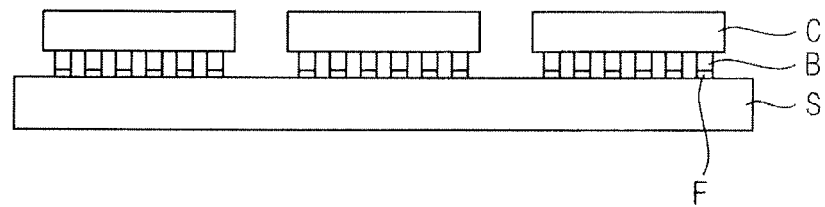

Referring to FIG. 13, in example embodiments, the plurality of the semiconductor chips C may be simultaneously bonded to one package substrate S. Alternatively, one semiconductor chip C may be bonded to the one package substrate S.

The bumps B and the fluxes F may be interposed between the semiconductor chips C and the package substrate S. The bumps B and the fluxes F may make contact with the pads of the semiconductor chips and the pads of the package substrate S.

Figure 14:
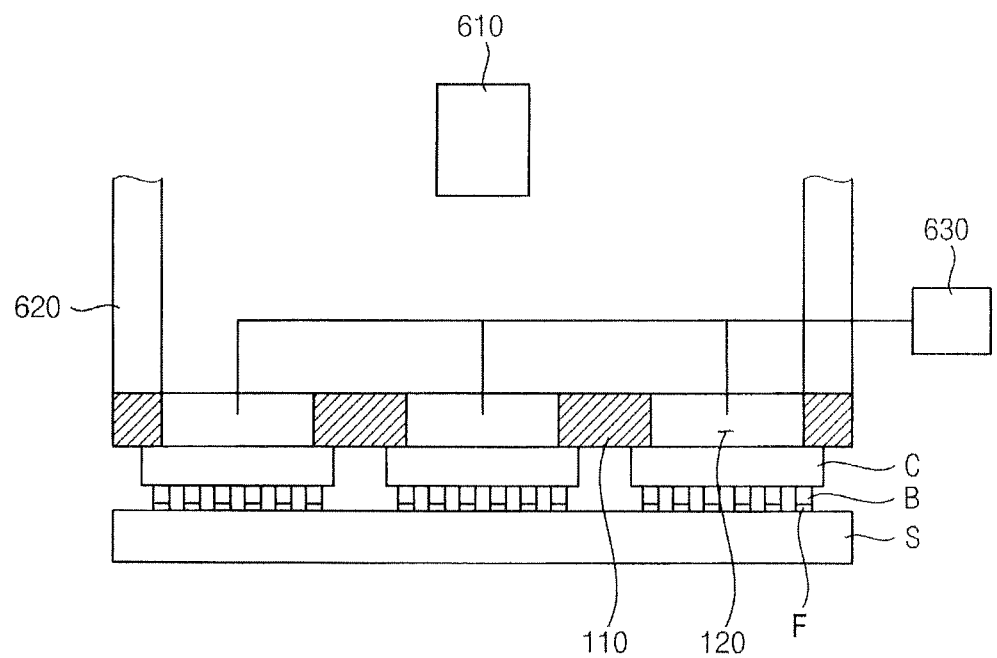

Referring to FIG. 14, the jig in FIG. 1 may be arranged on the upper surface of the semiconductor chip C. The central portion of the upper surface of each of the semiconductor chips C on which the bumps B may be arranged may be exposed through the openings 120. The pressurizing portion 110 may make contact with the edge portion of the upper surface of the semiconductor chip C. Alternatively, the jig in FIG. 4, the jig in FIG. 5, the jig in FIG. 8, the jig in FIG. 9 or the jig in FIG. 10 may be arranged on the upper surface of the semiconductor chip C.

Figure 15:
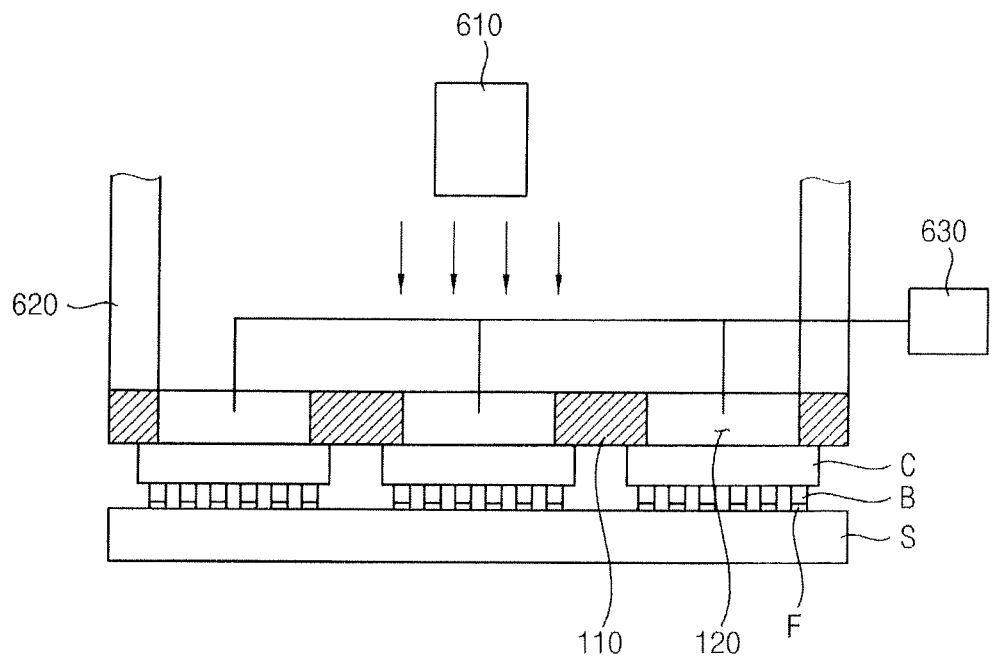

Referring to FIG. 15, the laser irradiation unit 610 may transmit laser radiation toward the upper surface of the semiconductor chip C. The central portion of the upper surface of the semiconductor chip C may be exposed to laser radiation through the opening 120 to heat the central portion of the upper surface of the semiconductor chip C.

The heat may then be transferred to the bumps B and the fluxes F to melt the bumps B and the fluxes F. The pads of the semiconductor chip and the package substrate S may be bonded to each other by the melted bump B and flux F.

During the bonding process, the pressurizing unit 620 may pressurize the edge portion of the upper surface of the semiconductor chip together with the pressurizing portion 110 of the jig to prevent the warpage of the semiconductor chip C.

Figure 16:
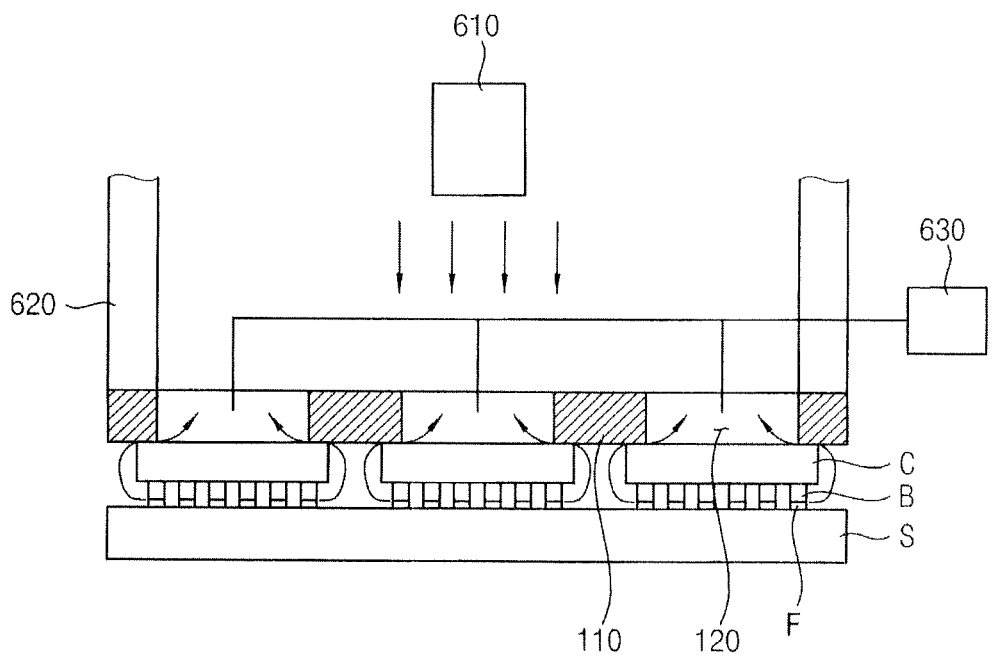

Referring to FIG. 16, the vapor may be generated from the flux F in the bonding process. The vapor may infiltrate into the space between the semiconductor chip C and the jig. The infiltrating vapor may be discharged through the opening 120. Thus, the contamination of the jig caused by the vapor may be prevented. As a result, the transmissivity of the laser through the jig may be maintained to improve the adhesion force between semiconductor chip C and the package substrate S via the bump B.

Further, the exhausting unit 630 may apply the vacuum through the opening 120 to exhaust the vapor outside the apparatus. Therefore, the contamination of the laser irradiation unit 610 caused by the vapor through the opening 120 may be prevented.

According to example embodiments, the vapor, which may be generated from the flux in the bonding process using the laser, infiltrating into the space between the semiconductor chip and the jig may be discharged through the opening. Thus, the contamination of the jig caused by the vapor may be prevented so that a transmissivity of the laser through the jig may be maintained. As a result, an adhesion force between the semiconductor chip and the package substrate may be improved. Particularly, because the jig may not be contaminated, it may not be required to clean the jig.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A jig for bonding a semiconductor chip, the jig comprising:
    a pressurizing portion configured to pressurize an upper surface of the semiconductor chip when bonding the semiconductor chip to a package substrate via a bump and a flux using a laser; and
    an opening in the pressurizing portion configured to expose the bump and the flux to laser radiation and through which a vapor generated from the flux by the laser is discharged.

2. The jig of claim 1, wherein the opening is arranged on a vertical line passing through the bump.

3. The jig of claim 2, wherein the pressurizing portion is arranged at a position shifted from the vertical line.

4. The jig of claim 3, wherein the pressurizing portion is configured to make contact with an edge portion of the upper surface of the semiconductor chip.

5. The jig of claim 4, wherein the pressurizing portion is configured to make contact with a central portion of the upper surface of the semiconductor chip.

6. The jig of claim 1, further comprising at least one auxiliary pressurizing portion extended from the pressurizing portion and arranged in the opening.

7. The jig of claim 6, wherein the auxiliary pressurizing portion is arranged in a diagonal line of the opening.

8. The jig of claim 6, wherein the auxiliary pressurizing portion is arranged in a direction substantially parallel to a side surface of the opening.

9. The jig of claim 6, wherein the auxiliary pressurizing portion has a width of about 0.1 mm to about 1.5 mm.

10. The jig of claim 1, wherein the pressurizing portion comprises a transparent material through which the laser is transmitted.

11. The jig of claim 10, wherein the pressurizing portion comprises a glass, quartz or a transparent plastic.

12. The jig of claim 1, wherein the pressurizing portion comprises a metal through which the laser is not transmitted.

13. The jig of claim 12, further comprising an anti-reflective layer on an upper surface of the pressurizing portion to prevent a reflection of the laser from the upper surface of the pressurizing portion.

14. The jig of claim 12, wherein the pressurizing portion comprises stainless steel or aluminum.

15. An apparatus for bonding a semiconductor chip, the apparatus comprising:
    a laser irradiation unit arranged to expose a bump and a flux between the semiconductor chip and a package substrate to laser radiation; and
    a jig comprising a pressurizing portion configured to pressurize an upper surface of the semiconductor chip, and an opening in the pressurizing portion configured to expose the bump and the flux to the laser radiation and through which a vapor generated from the flux by the laser radiation is discharged.

16. The apparatus of claim 15, further comprising an exhausting unit configured to apply a vacuum through the opening.

17. The apparatus of claim 15, further comprising a pressurizing unit configured to press the pressurizing portion.

18. A method of bonding a semiconductor chip, the method comprising:

disposing a bump and a flux between a pad of the semiconductor chip and a pad of a package substrate;

disposing a jig comprising a pressurizing portion configured to pressurize an upper surface of the semiconductor chip, and an opening in the pressurizing portion;

exposing the bump and the flux to laser radiation through the opening to bond the bump to the pads; and discharging a vapor generated from the flux through the opening.

19. The method of claim 18, further comprising pressing the pressurizing portion toward the semiconductor chip.

20. The method of claim 18, further comprising providing the opening with vacuum.

* * * * *